(12) United States Patent
Felix et al.

(10) Patent No.: US 8,385,466 B2
(45) Date of Patent: Feb. 26, 2013

(54) TRANSMITTING A SIGNAL FROM A POWER AMPLIFIER

(75) Inventors: Stephen Felix, Bristol (GB); Steve Allpress, Bristol (GB)

(73) Assignee: Icera Inc., Wilmington, DE (US)

( * ) Notice: Subject to any disclaimer, the term of this patent is extended or adjusted under 35 U.S.C. 154(b) by 0 days.

(21) Appl. No.: 13/222,471

(22) Filed: Aug. 31, 2011

(65) Prior Publication Data

US 2012/0057650 A1  Mar. 8, 2012

(30) Foreign Application Priority Data

Sep. 3, 2010 (GB) .................... 1014659.5

(51) Int. Cl.
*H04K 1/02* (2006.01)
*H04L 25/03* (2006.01)
*H04L 25/49* (2006.01)

(52) U.S. Cl. ............. 375/297; 375/296; 455/114.2; 455/114.3; 398/193

(58) Field of Classification Search .......... 375/259, 375/296–297; 455/114.2–114.3; 398/193
See application file for complete search history.

(56) References Cited

U.S. PATENT DOCUMENTS

| | | | |
|---|---|---|---|
| 2005/0163248 A1* | 7/2005 | Berangi et al. | ............. 375/296 |
| 2009/0237158 A1 | 9/2009 | Hehn | |
| 2010/0158166 A1 | 6/2010 | Gandhi | |
| 2010/0244953 A1 | 9/2010 | Brown et al. | |
| 2011/0286550 A1* | 11/2011 | Mirbagheri et al. | ......... 375/296 |

FOREIGN PATENT DOCUMENTS

| | | |
|---|---|---|
| WO | 2006072669 A1 | 7/2006 |
| WO | 2010141160 A1 | 12/2010 |
| WO | 2011098861 A1 | 8/2011 |

OTHER PUBLICATIONS

Marsili, S. "Algorithm for Peak to Average Power Ratio Reduction Operating at Symbol Rate," IEEE, 2005, pp. 5497-5500.
"Universal Mobile Telecommunications System (UMTS); Spreading and Modulation (FDD)," 3GPP TS 25.213 version 8.4.0 Release 8, ETSI TS 125 213, V8.4.0, Mar. 2009, 38 pages.

* cited by examiner

*Primary Examiner* — Curtis Odom (57) ABSTRACT

A method for limiting peak-to-average power of a signal transmitted from a power amplifier. The method comprises: applying a pulse-shape filter to a first signal, thereby generating a second signal being a filtered version of the first signal; and outputting the second signal for transmission from a power amplifier. The method further comprises: applying each of a plurality of predictor filters to a respective instance of the first signal, each predictor filter approximating the application of the pulse-shape filter to the first signal based on a different respective set of filter coefficients, and each thereby generating a respective third signal. The method also further comprises determining an indicator of amplitude of each of the third signals, selecting the indicator corresponding to the largest of those amplitudes, generating a modifier based on the selected indicator, and using the modifier to limit the first signal prior to applying the pulse-shape filter.

33 Claims, 4 Drawing Sheets

TRANSMITTING A SIGNAL FROM A POWER AMPLIFIER

CROSS-REFERENCE TO RELATED APPLICATION

This application claims the benefit of GB Application No. 1014659.5 filed on Sep. 3, 2010, entitled "TRANSMITTING A SIGNAL FROM A POWER AMPLIFIER", commonly assigned with this application and incorporated herein by reference.

TECHNICAL FIELD

The present disclosure relates to limiting peak-to-average power of a signal transmitted from a power amplifier, e.g. for transmission over a wireless cellular network.

BACKGROUND

Figure 1:
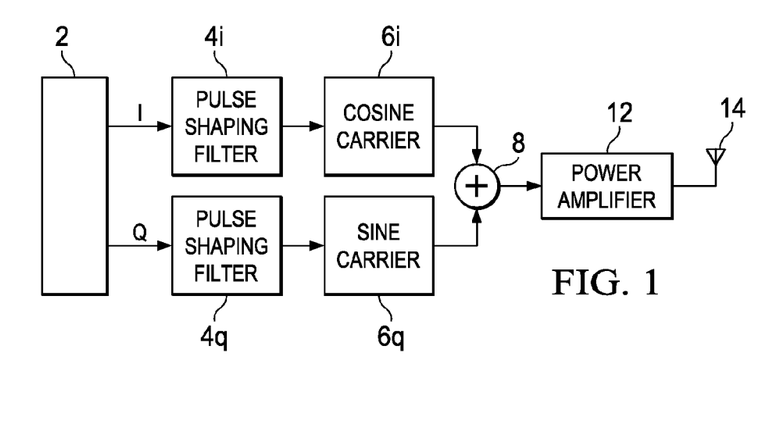
FIG. 1 is a schematic block diagram of a wireless transmitter.

FIG. 1 is a schematic block diagram of a wireless transmitter. The transmitter comprises an initial data processing stage 2 arranged to generate data on an in-phase (I) branch and a quadrature branch (Q). In operation, the data processing stage 2 begins by generating digital data for one or more channels to be modulated for transmission via the I branch and one or more channels to be modulated for transmission via the Q branch.

The data on each channel is initially generated in binary form. As a first step of the modulation, the data processing stage 2 then maps each of a sequence of binary data portions from that channel onto an actual value. For example, in a binary phase-shift keying (BPSK) scheme each logical 0 in the sequence is mapped onto an actual value −1 and each logical 1 is mapped onto an actual value +1. Or as another example, in a 4-QAM scheme each two-bit portion of binary data 00, 01, 10 or 11 in the sequence is mapped onto one of a set of four actual values such as 0.4472, 1.3416, −0.4472 and −1.3416 respectively.

Each value is then multiplied by a higher-rate spreading code comprising multiple higher-rate "chips" for each un-spread value, with a different respective spreading code being used for each channel according to a code division multiple access (CDMA) scheme. As will be familiar to a person skilled in the art, since each channel is spread by a different orthogonal spreading code, this allows different channels from the same transmitter and/or other transmitters to be multiplexed over the same frequency at the same time in the same physical space yet still be separately identified at the receiver(s). Also, since the spreading code comprises multiple chips for each un-spread value then the sample rate is increased to a higher rate referred to as the "chipping" rate, equal to 3.84Msps in current WCDMA standards.

Each channel is then also weighted by a respective weighting factor. Finally, if there are a plurality of channels to be modulated via the I branch then the data processing stage 2 multiplexes the spread, weighted data from those channels into a combined I component which it outputs onto the I branch. If there are a plurality of channels to be modulated via the Q branch then the spread, weighted data from those channels is multiplexed into a combined Q component which is output onto the Q branch. (Or alternatively the I and/or Q component could result from only a single I or Q channel respectively.

Details of the above mapping, spreading and weighting steps are provided, for example, in 3GPP TS 25.213, Technical Specification Group Radio Access Network, "Spreading and Modulation (FDD)".

Figure 2:
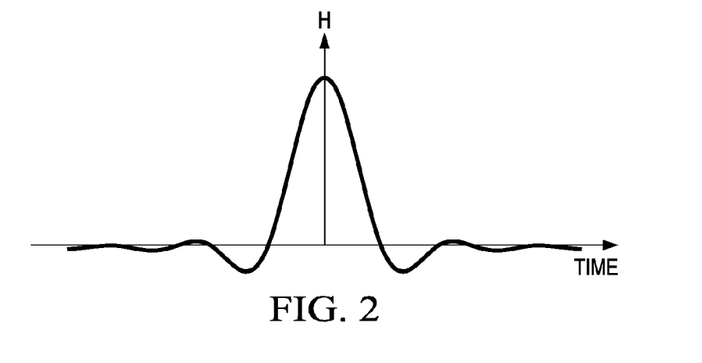
FIG. 2 is a sketch of the impulse response of a pulse-shape filter.

The transmitter further comprises a pulse-shape filter 4 comprising a constituent I-branch pulse-shape filter $4_i$ and Q-branch pulse-shape filter $4_q$. The output from the data processing stage 2 on the in-phase (I) branch is coupled to the input of the I-branch pulse-shape filter $4_i$, and the output from the data processing stage 2 on the quadrature branch (Q) is coupled to the input of a Q-branch pulse-shape filter $4_q$. A pulse-shape filter 4 may also be referred to as a shaping filter or sometimes a channel filter. Each constituent pulse-shape filter $4_i$, $4_q$ typically operates in the time domain. Each of the constituent pulse-shape filters $4_i$, $4_q$ may be a Root Raised Cosine (RRC) filter parameterized by a roll-off factor α of −0.22 according to current WCDMA standards. The impulse response H(t) of such a filter is shown schematically in the sketch of FIG. 2. Thus the I-branch pulse-shape filter $4_i$ filters the I component generated by the data processing stage 2 so as to output a filtered version of the I component filtered according to H(t). Similarly the Q-branch pulse-shape filter $4_q$ filters the Q component generated by the data processing stage 2 so as to output a filtered version of the Q component filtered according to H(t). Thus for each data sample input into the pulse-shape filter $4_i$ or $4_q$ representing the unshaped I or Q component at some point in time, the pulse-shape filter 4 spreads the effect of that data over time according to a pulse shape defined by the function H(t), with the effects from the samples from different times being superimposed with one another. The operation of such a time-domain filter 4 will be familiar to a person skilled in the art.

The output of the I-branch filter $4_i$ is coupled to the input of a cosine modulation block $6_i$ where the filtered version of the I component is modulated by a cosine carrier so as to output a modulated version of the I component on the I branch. The output of the Q-branch filter $4_q$ is coupled to the input of a sine wave modulation block $6_q$ where the filtered version of the Q component is modulated by a sine wave carrier so as to output a modulated version of the Q component on the Q branch. Because the Q component is modulated by a carrier that is 90° (π/2 radians) out of phase with the carrier of the I component, then the I and Q components together may be considered to form a complex signal which may be represented mathematically by an expression of the form I+jQ.

The outputs of the cosine and sine modulation blocks $6_i$ and $6_q$ are coupled to respective inputs of an adder 8, where the shaped, modulated I and Q components from the two respective branches are summed so as to generate a combined output for transmission. Finally this combined output is coupled to a power amplifier (PA) 12 via an upconversion mixer stage and analog-to-digital converter (not shown), such that the combined output signal is mixed up to radio frequency, converted to analog and then amplified for wireless transmission via an antenna 14. These techniques are typically used for transmission over a wireless cellular network.

Recent cellular radio communications standards such as LTE, WiMAX and the HSPA+ and HSUPA parts of WCDMA specify uplink modulation schemes that can result in a relatively high Peak-to-Average-Ratio (PAR) of power compared with older cellular communications standards such as GSM/EDGE and Release-99 WCDMA.

At the same time, very stringent requirements exist for limiting the Adjacent Channel Leakage Ratio (ACLR)—that is, the level of unwanted emissions in the adjacent radio channel. Also, the signal must be distorted as little as possible; this requirement is expressed as a limit on the Error Vector Magnitude (EVM) of the transmitted uplink signal.

Generally speaking, increased non-linearity in the radio frequency power amplifier (PA) leads to increased adjacent channel leakage and distortion.

Achieving PA linearity while maximizing PA power efficiency becomes easier when the PAR is lower (and vice-versa).

Thus if the uplink signal could be somehow pre-distorted so as to lower the PAR of the signal amplified by the PA 12 without degrading the EVM unacceptably, then it would be possible to make the PA more power efficient. This is particularly important in hand-held and portable equipment (e.g. smartphones, netbooks, etc.) where a significant amount of battery power is consumed by the PA and any reduction would be beneficial, both in terms of extending the time for which the equipment can be used before re-charging the battery and in terms of limiting the amount of heat generated by the PA itself.

Some pre-processing schemes for limiting PAR have been proposed already. One such scheme is disclosed in "Algorithm for Peak to Average Power Ratio Reduction operating at Symbol Rate", by Stefano Marsili, Infineon Technology, Austria AG, Villach, Austria. IEEE ISCAS 2005. (Hereinafter referred to as Marsili.) However, this scheme has a high computational complexity and hence incurs a high processing burden in terms of processing cycles. It was also designed for the downlink signal which historically has always had a much higher PAR than the uplink signal, and it cannot be assumed that such a scheme would be applicable on the uplink whilst still meeting strict ACLM and EVM requirements.

SUMMARY

According to one aspect, the disclosure provides a method of limiting peak-to-average power of a signal transmitted from a power amplifier. In one embodiment, the method includes: (1) generating a first signal, (2) applying a pulse-shape filter to the first signal, thereby generating a second signal being a filtered version of the first signal, (3) outputting the second signal for transmission from a power amplifier, (4) applying each of a plurality of predictor filters to a respective instance of the first signal, each predictor filter approximating the application of the pulse-shape filter to the first signal based on a different respective set of filter coefficients, and each thereby generating a respective third signal, (5) determining an indicator of amplitude of each of the third signals, (6) selecting the indicator corresponding to the largest of said amplitudes, (7) generating a modifier based on the selected indicator and (8) using the modifier to limit the first signal prior to applying the pulse-shape filter.

According to another aspect, the disclosure provides a computer program product for limiting peak-to-average power of a signal transmitted from a power amplifier. In one embodiment, the computer program product includes code embodied on a non-transient computer-readable medium and configured so as when executed on a processing apparatus to: (1) generate a first signal, (2) apply a pulse-shape filter to the first signal, thereby generating a second signal being a filtered version of the first signal, (3) output the second signal for transmission from a power amplifier, (4) apply each of a plurality of predictor filters to a respective instance of the first signal, each predictor filter approximating the application of the pulse-shape filter to the first signal based on a different respective set of filter coefficients, and each thereby generating a respective third signal, (5) determine an indicator of amplitude of each of the third signals, (6) select the indicator corresponding to the largest of said amplitudes, (7) generate a modifier based on the selected indicator and (8) use the modifier to limit the first signal prior to applying the pulse-shape filter.

In yet another embodiment, the disclosure provides a transmission system. In one embodiment, the transmission system includes: (1) a signal processing apparatus configured to generating a first signal and to apply a pulse-shape filter to the first signal, thereby generating a second signal being a filtered version of the first signal and (2) a power amplifier arranged to transmit the second signal for transmission from a power amplifier. The signal processing apparatus is further configured to: apply each of a plurality of predictor filters to a respective instance of the first signal, each predictor filter approximating the application of the pulse-shape filter to the first signal based on a different respective set of filter coefficients, and each thereby generating a respective third signal; determine an indicator of amplitude of each of the third signals; select the indicator corresponding to the largest of said amplitudes; generate a modifier based on the selected indicator; and use the modifier to limit the first signal prior to applying the pulse-shape filter.

BRIEF DESCRIPTION

Reference is now made to the following descriptions taken in conjunction with the accompanying drawings, in which.

DETAILED DESCRIPTION

The disclosure recognizes the benefit of a practical peak-to-average ratio (PAR) power limiter which can operate with reduced computational complexity compared to conventional PAR power limiters but with little or no ACLR degradation. Additionally, the disclosure also recognizes the benefit of operating such a power limiter on the uplink while still meeting the strict ACLM and EVM restrictions.

As mentioned, Marsili proposes a pre-processing scheme for limiting the peak-to-average power ratio (PAR). However, the Marsili scheme is complicated to implement, and hence incurs a high processing burden. Particularly, the technique in Marsili requires calculating the amplitude of four interpolated signals (requiring four square root operations), determining four sets of complex additive correction terms ($e_{i=1\ldots4}$), filtering those terms to time align them with the original signal value, and finally, selecting the maximum of the four filtered complex correction terms for subtracting from the signal being transmitted prior to the shaping filter.

In contrast, the disclosure provides embodiments wherein the modifier is calculated directly based on a measure of the amplitude from just one selected predictor filter. The second and third signals may each be complex comprising a respective pair of in-phase and quadrature components, and the determination of the indicator of amplitude of each of the third signals is based on the respective pair of in-phase and quadrature components combined. The indicator of amplitude may be equal to the sum of the squares of the respective pair of in-phase and quadrature components, thus indicating the amplitude in terms of its square. The modifier may be a multiplicative factor, and the limiting comprises attenuating the first signal using the factor.

For example the factor may be substantially equal to $1/\sqrt{(L/X)}$ where X is the selected indicator and L is a constant. The attenuating may be performed on condition of the factor being less than one.

So in some embodiments, the filter outputs are combined to generate a multiplicative term to reduce the maximum: namely MAX followed by 1/(sqrt). Advantageously, this may only involve one square root operation, and avoid the need to calculate multiple modifier terms. Thus in at least one embodiment the improved scheme only operates on the maximum amplitude, and in fact may only operate on the magnitude squared for increased simplicity. Typically, this method is less complicated (less costly to implement) than the technique described in Marsili. At the same time, the disclosed schemes can be implemented without an unacceptable increase in adjacent channel leakage or distortion of the transmitted signal (e.g. measured in terms of the ACLR and EVM respectively).

Thus, the disclosure is able to provide a practical PAR power limiter which operates with reduced computational complexity but with little or no ACLR degradation and an acceptable increase in EVM.

Furthermore, in one application disclosed herein the transmission from the power amplifier is performed on an uplink of a wireless cellular network.

As mentioned, Marsili was designed for the downlink signal which historically has always had a much higher PAR than the uplink signal.

In addition to a PAR power limiter, the disclosure provides a method of limiting peak-to-average power of a signal transmitted from a power amplifier. In some embodiments, the factor may be generated by approximating $1\sqrt{(L/X)}$ to equal $A+X(B+X(C+XD))$, where A, B, C and D are constants related to L.

In one implementation, A may be substantially equal to 1.677, B may be substantially equal to $-0.938/L$, C may be substantially equal to $0.295/L^2$ and D may be substantially equal to $-0.035/L^3$.

The first signal may include a partially modulated signal, and the method may include further modulating the second signal for transmission from the power amplifier.

The pulse-shape filter may comprise a time domain filter. The pulse-shape filter may comprise a root raised cosine filter. The root raised cosine filter may be parameterised by a roll-off parameter $\alpha=-0.22$.

Each of the predictor filters may comprise a time-domain filter. Each of the predictor filters may comprise a finite impulse response filter.

Each of the predictor filters may represent the pulse-shape filter using a respective set of eight filter coefficients.

The first signal may be generated having a predetermined sample rate, and each of the predictor filters may operate at four times the sample rate. The sample rate may be a chip rate of a code division multiple access scheme.

The method may comprise applying each of four predictor filters to a respective instance of the first signal.

The method may comprise introducing a delay on a path between (a) the determination of the indicator of amplitude of the third signal from at least one but not all of the predictor filters and (b) the selection of the largest indicator.

The largest indicator may be selected from amongst a set including, determined from the third signal generated from the same predictor filter, at least one indicator with the delay applied and one indicator without the delay applied.

Figure 3:
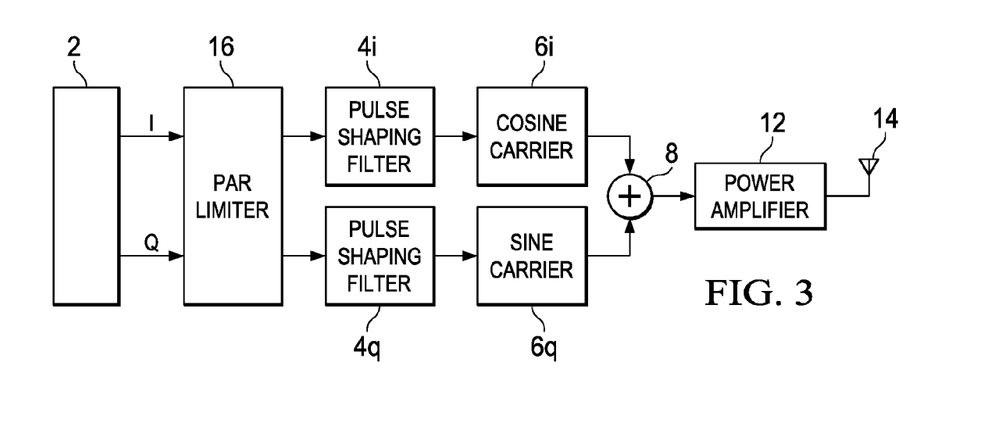
FIG. 3 is a schematic block diagram of an embodiment of an improved transmitter.
Figure 4:
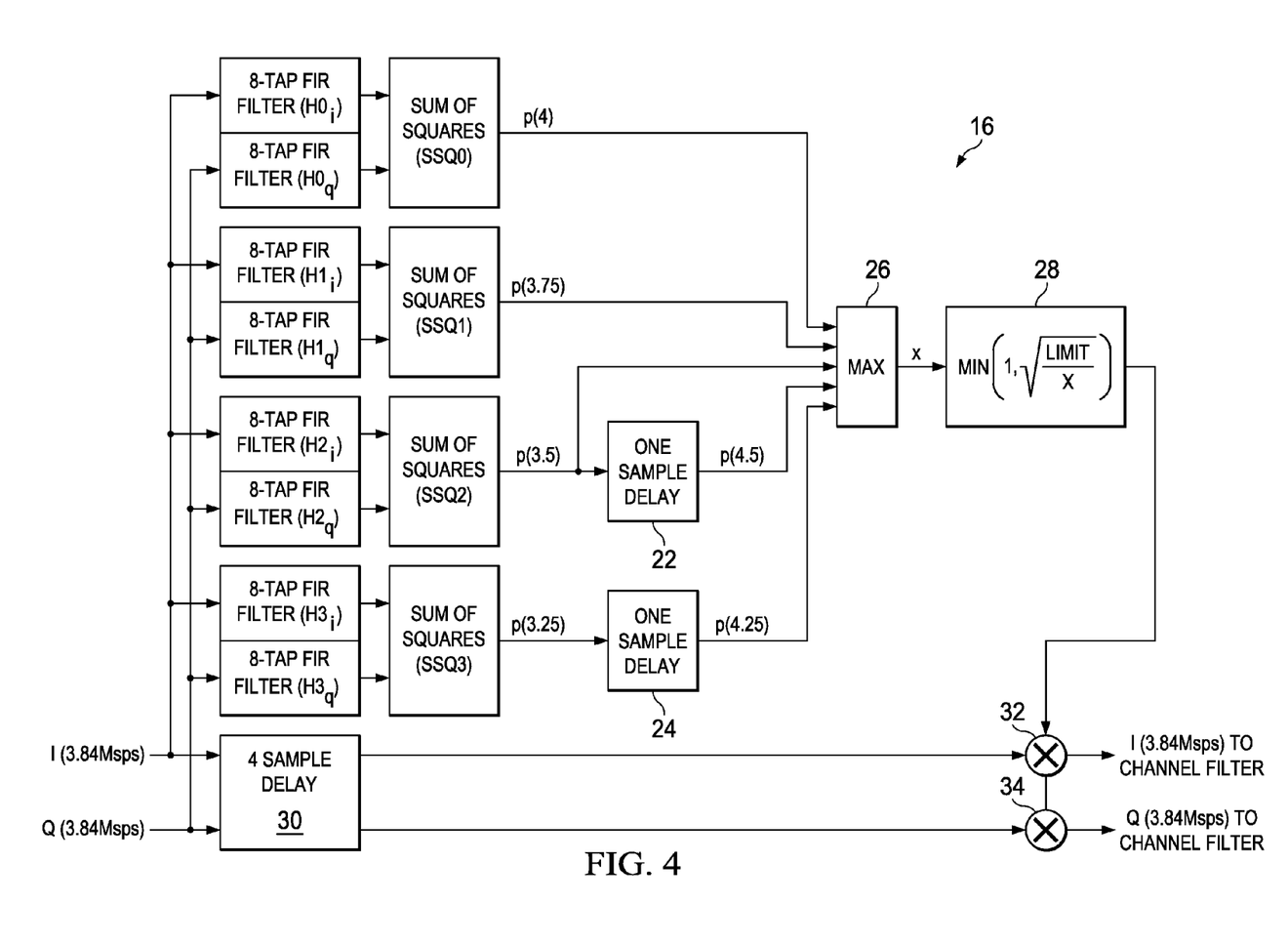
FIG. 4 is a schematic block diagram of an embodiment of a peak-to-average (PAR) power limiter.

Turning now to illustrated embodiments, FIGS. 3 and 4 provide a schematic illustration of a signal processing technique suitable for implementation in a WCDMA system (including HSUPA/HSPA+). The signal processing described could be implemented by dedicated digital circuits, and/or as software stored on a non-transient storage medium and arranged for execution by the same microprocessor (DSP) that is used to generate the uplink symbols. All of the signal processing illustrated below takes place at the WCDMA chipping rate of 3.84 MHz.

The technique operates by scaling a CDMA signal depending on the peak power of a prediction of the pulse shaped, interpolated signal over a small window (such as 1 chip wide). It comprises digitally pre-processing a stream of uplink symbols before they are passed through a pulse-shape filter (a Root-Raised-Cosine filter in the case of WCDMA), digital-to-analog converted, up-converted to the radio frequency, power amplified and transmitted. The pre-processing is such that the PAR is reduced in exchange for an acceptable degradation in EVM. The ACLR is completely unaltered by such pre-processing since the pre-processing occurs at the symbol/chipping rate, before the pulse-shape filter.

FIG. 3 illustrates a transmitter similar to that of FIG. 1, but with a PAR limiter 16 arranged between the output of the initial data processing stage 2 and the input of the pulse-shape filters $4_i$ and $4_j$ so as to limit the peak-to-average ratio (PAR) of the power of signals passing therebetween. That is, the I-branch output of the data processing stage 2 is coupled to a corresponding I-branch input of the PAR limiter 16, and a corresponding I-branch output of the PAR limiter 16 is coupled to the input of the I-branch pulse-shape filter $4_i$. Similarly, the Q-branch output of the data processing stage 2 is coupled to a corresponding Q-branch input of the PAR limiter 16, and a corresponding Q-branch output of the PAR limiter 16 is coupled to the input of the Q-branch pulse-shape filter $4_j$. In operation, the PAR limiter 16 uses the I and Q components of the first signal combined in order to generate a multiplicative scaling factor by which to attenuate the I and Q components of the first signal before forwarding these attenuated components onwards to the I and Q branch pulse-shape filters $4_i$ and $4_j$.

The output from the data processing stage 2 may be considered as a first complex signal, which is then limited (scaled down) by the PAR limiter 16 prior to applying the pulse-shape filter 4. The first complex signal is received by the PAR limiter 16 at the chipping rate of 3.84Msps (mega samples per second) on each of its I and Q branch inputs. The PAR limiter 16 then processes the first signal in the chipping rate domain, and outputs the limited first version of the first signal at the chipping rate onto each of its I and Q outputs. The pulse-shape filter 4 then receives the limited version of the first complex signal and filters it to produce a second complex signal being a filtered version of the limited first signal. The pulse-shape filter 4 is a time domain filter arranged to perform a pulse shaping operation as step in the signal modulation scheme.

The purpose of the PAR limiter 16 is to limit peaks in the transmitted signal exceeding a fixed threshold so as to limit the peak-to-average ratio and thereby avoid non-linearity in the power amplifier (PA) 12, but at the same time whilst causing as little distortion as possible.

In the illustrated embodiment, the PAR limiter 16 may be configured so as only to apply the scaling factor on condition that the scaling factor is less than 1. If the scaling factor is greater than 1 then the first signal is passed to the pulse-shape filter without modification—it is not desired to scale up the signal.

An implementation of the PAR limiter 16 is shown in FIG. 4. The PAR limiter 16 includes a plurality of parallel predictor filters: a first predictor filter H0 comprising a first constituent I-branch predictor filter $H0_i$ and a first constituent Q-branch predictor filter $H0_q$, a second predictor filter H1 comprising a second constituent I-branch predictor filter $H1_i$ and a second constituent Q-branch predictor filter $H1_q$, a third predictor filter H2 comprising a third constituent I-branch predictor filter $H2_i$ and a third constituent Q-branch predictor filter $H2_q$, and a fourth predictor filter H3 comprising a fourth constituent I-branch predictor filter $H3_i$ and a fourth constituent Q-branch predictor filter $H3_q$. Each of the first, second, third and fourth I-branch predictor filters $H0_i$-$H3_i$ has an input arranged to receive a respective parallel instance of the I component of the first complex signal, i.e. of the signal from the I-branch output of the initial data processing stage 2. Similarly, each of the first, second, third and fourth Q-branch predictor filters $H0_q$-$H3_q$ has an input coupled to receive a respective parallel instance of the Q component of the first complex signal, i.e. of the signal from the Q-branch output of the data processing stage 2. Each predictor filter H0-H3 is a finite impulse response (FIR) filter operating in the time domain.

The purpose of each predictor filter H0-H3 is to model the pulse-shape filter 4 based on a few filter coefficients. This is illustrated schematically in the sketch of FIG. 5. The sketched curve shows the impulse response H(t) of the pulse-shape filter 4, as in FIG. 2, and the "o" and "x" show the filter coefficients used in two of the predictor filters H0 and H1 respectively. Further mutually different sets are also used for the third and fourth predictor filters H2 and H3, though for simplicity these are not shown in FIG. 5. Each set of coefficients represent an approximation of the same pulse-shape filter 4 but using a different respective set of coefficients, the different sets being offset from one another by different time phases.

Figure 5:
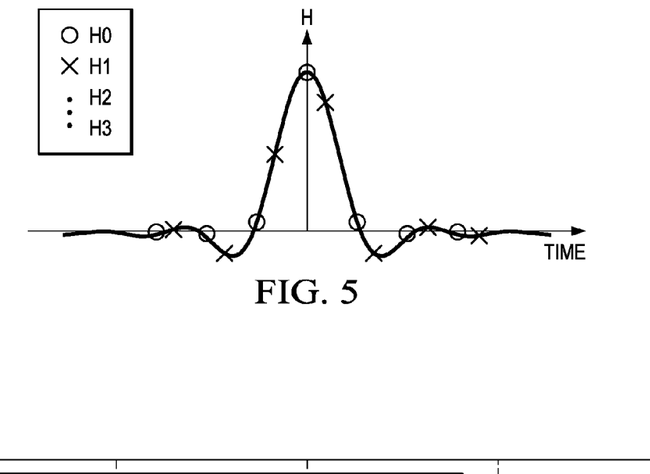
FIG. 5 is a sketch showing the coefficients of different predictor filters.
Figure 6:
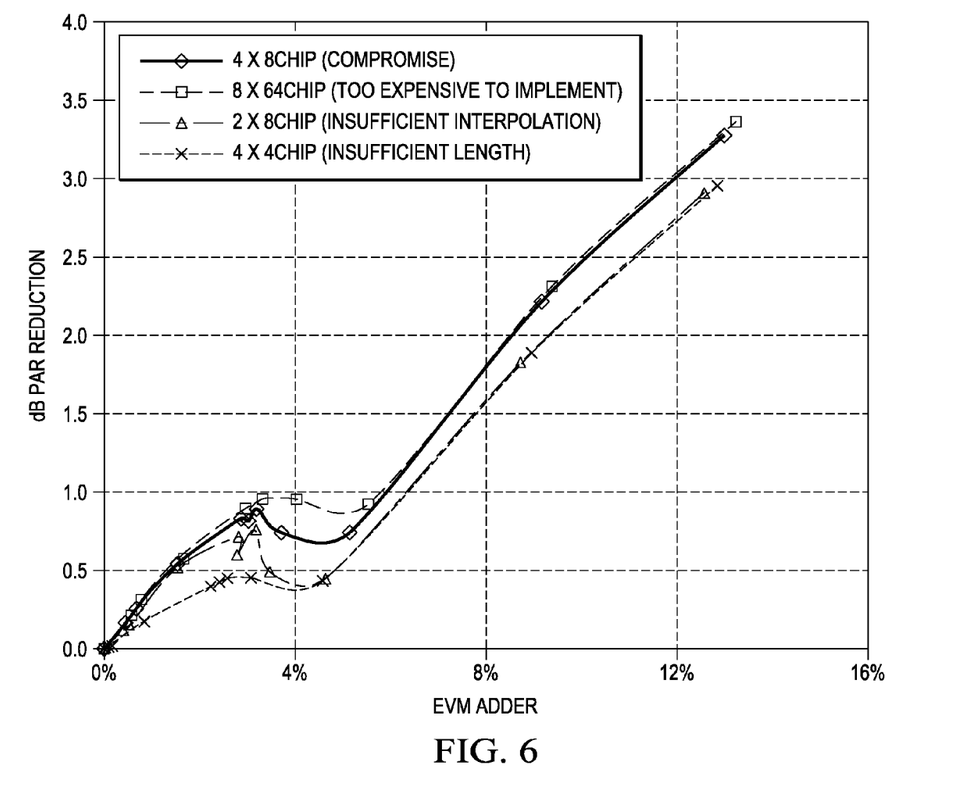
FIG. 6 is a plot of simulation results showing PAR vs. EVM.

In one implementation eight filter coefficients are used for each predictor filter on each of the I and Q branches, i.e. eight coefficients for $H0_i$, the same eight coefficients for $H0_q$, another set of eight coefficients for $H1_1$, and so forth. The filter coefficients may be RRC impulse response coefficients at four times the chip rate. For example:
H0={+0.025, −0.038, +0.050, −0.057, +1.060, −0.057, +0.050, −0.0381}
H1={+0.005, +0.015, −0.065, +0.247, +0.939, −0.200, +0.100, −0.052}
H2={−0.030, +0.077, −0.179, +0.625, +0.625, −0.179, +0.077, −0.030}
H3={−0.052, +0.100, −0.200, +0.939, +0.247, −0.065, +0.015, +0.005}.

Thus each predictor filter H0, H1, H2 and H3 is configured to model the operation of the pulse-shape filter 4 using a different respective set of filter coefficients, and thereby to each generate a respective third complex signal (comprising I and Q components) providing a different respective estimate or prediction of the second signal—i.e. a different respective estimate of the output of the pulse-shape filter 4 on each of the I and Q branches. Specifically, each third signal provides an estimate of what the output of the pulse-shape filter 4 would be if the PAR limiter 16 was not applied. As discussed in the following, these estimates can be used to determine whether the scaling operation should in fact be applied, and if so by what factor.

To this end, the PAR limiter 16 includes first, second, third and fourth sum-of-squares blocks $SSQ_0$, $SSQ_1$, $SSQ_2$ and $SSQ_3$ each disposed at the output of a respective one of the predictor filters H0, H1, H2 and H3 and arranged to receive the I and Q components of the respective third signal as an input. Each sum-of-squares block SSQ is arranged to calculate the sum of the square of the I and Q components of its respective third signal. The square of the I and Q components provides an indicator of the amplitude of the respective third signal, i.e. of the amplitude of the respective predictor filter output. At this stage the actual amplitude (the square root of the sum of the squares) need not be calculated so as to avoid unnecessary computation. Instead the sum of squares without a square root operation provides a suitable indictor of the amplitude for use in the next step.

That is, the indicators of the amplitudes of the different third signals are supplied to a further component of the PAR limiter 16 in the form of a selection block (MAX) which is configured to select the maximum of the indicators, i.e. the indicator representing the largest amplitude output by one of the predictor filters H0-H3. This maximum indicator is represented by X in FIG. 4 and the following calculations. X is equal to the square of the maximum of the amplitudes of the different third signals output by the different predictor filters.

Next the PAR limiter 26 comprises a scaling factor calculation block 28 which is arranged to receive X as an input and is configured to calculate a modifier in the form of a scaling factor. The scaling factors is calculated as:

$$\mathrm{MIN}\left(1, \sqrt{\frac{\mathrm{Limit}}{X}}\right)$$

That is, if X is above a threshold Limit then the scaling factor is √(Limit/X) and if X is equal to or below the threshold then the scaling factor is 1 (i.e. the first signal is not altered).

In one embodiment, the following approximation may be used in order to simplify computation:

$$\sqrt{\frac{\mathrm{Limit}}{X}} \approx A + X(B + X(C + XD))$$

Where A, B, C & D are pre-calculated from Limit as:
A=1.677
B=−0.938/Limit
C=0.295/Limit$^2$
D=−0.035/Limit$^3$ More generally however, the filter coefficients of the predictor filters can be weighted by any value provided that the value of Limit is adjusted accordingly.

In order to apply the scaling factor the PAR limiter comprises an I-branch multiplier 32 and a Q-branch multiplier 34. The I-branch multiplier 32 is arranged to receive the I component of the first signal from the I-branch output of the initial data processing stage 2, and the Q-branch multiplier 34 is arranged to receive the Q component of the first signal from the Q-branch output of the data processing stage 2. Each of the I-branch multiplier 32 and Q-branch multiplier 34 is also arranged to receive the scaling factor from the scaling factor calculation block 28. The I-branch multiplier 32 may therefore be arranged to multiply the I component received from the data processing stage 2 by the scaling factor, and to output the scaled (limited) result on the I branch output to the cosine carrier modulation block $6_i$. The Q-branch multiplier 34 is also arranged to multiply the Q component received from the data processing stage 2 by the scaling factor, and to output the scaled (limited) result on the Q branch output to the sine wave carrier modulation block $6_q$.

The four 8-tap filters (H0 to H3) provide an efficient way of implementing a 4× interpolating, 32-tap FIR filter. It would alternatively be possible to use a single 32-tap filter as the predictor filter. However, a single 32-tap filter would need to run at 4× the rate (15.36 MHz) in order to generate the same four output samples as the four 8-tap filters running at 3.84 MHz. In a 32-tap filter implementation, 3 out of 4 incoming data samples would be zeroes, i.e. the data is 4× interpolated by zero padding prior to FIR filtering, and thus 75% of the multiply/add operations would be redundant. On the other hand, a 4-filter 'multiphase' implementation takes advantage of this redundancy. The zero padding is implicit and no redundant operations take place. In fact, even if the predictor was described as a 'single' interpolating filter running at 4× the input sample rate, it could still be considered as finding the maximum of the 5 interpolated samples local to each input sample. The 4-filter implementation pictured is functionally no different. However, it may be more efficient. Also, another issue to consider is the amount of interpolation performed by the predictor (regardless of how it is implemented). If no interpolation at all is performed, then the system will perform very poorly. It is already possible to see some degradation in performance when 2× interpolation is performed instead of 4× interpolation. See the results shown in FIG. 7 for "2×8 chip" and "4×8 chip".

Further, the PAR limiter 16 comprises a four-sample delay block 30 on the path between the initial data processing stage 2 and the multipliers 32 and 24, to ensure the first signal is correctly aligned in time with the third signals. That is, to ensure the signal received from the data processing stage 2 is properly aligned H0-H3, since the estimation process will take some time to operate.

Furthermore, the PAR limiter 16 may comprise a one sample delay block 24 on the path between the fourth sum-of-squares block $SSQ_3$ and the MAX block 26; and a one sample delay block 22 on the path between the third sum-of-squares block $SSQ_2$ and the MAX block 26; thus feeding the indicators from the sum-of-squares blocks $SSQ_2$ and $SSQ_3$ into the MAX block 26 with a delay applied. In addition, a separate parallel path may be provided feeding the indicator from the third sum-of-squares block $SSQ_2$ to the MAX block 26, thus effectively providing a set of five possible indicators from which to choose the maximum but derived from only four predictor filters H0-H3.

The purpose of the delay blocks is to equalize the delay through the system as to match each input sample to the correct corresponding output sample.

According to the technique discussed above, the FIR filters H0-H3 are used to predict whether peaks greater than a threshold 'Limit' will exist after channel (RRC) filtering. If any such peaks are detected, then the original signal is down-scaled multiplicatively in attempt to limit the peak to the limit value. Though imperfect, this method has been found to be very effective.

The reduction in PAR is roughly proportional to an increase in EVM (distortion). Also, the PAR achieved is not much higher than the threshold. These two results imply that the correct symbols are being pre-distorted and by the correct amount (if symbols are distorted unnecessarily, the PAR will be unaffected but the EVM will worsen; and if symbols are not distorted when they should have been then the PAR be higher than the threshold).

Figure 7:
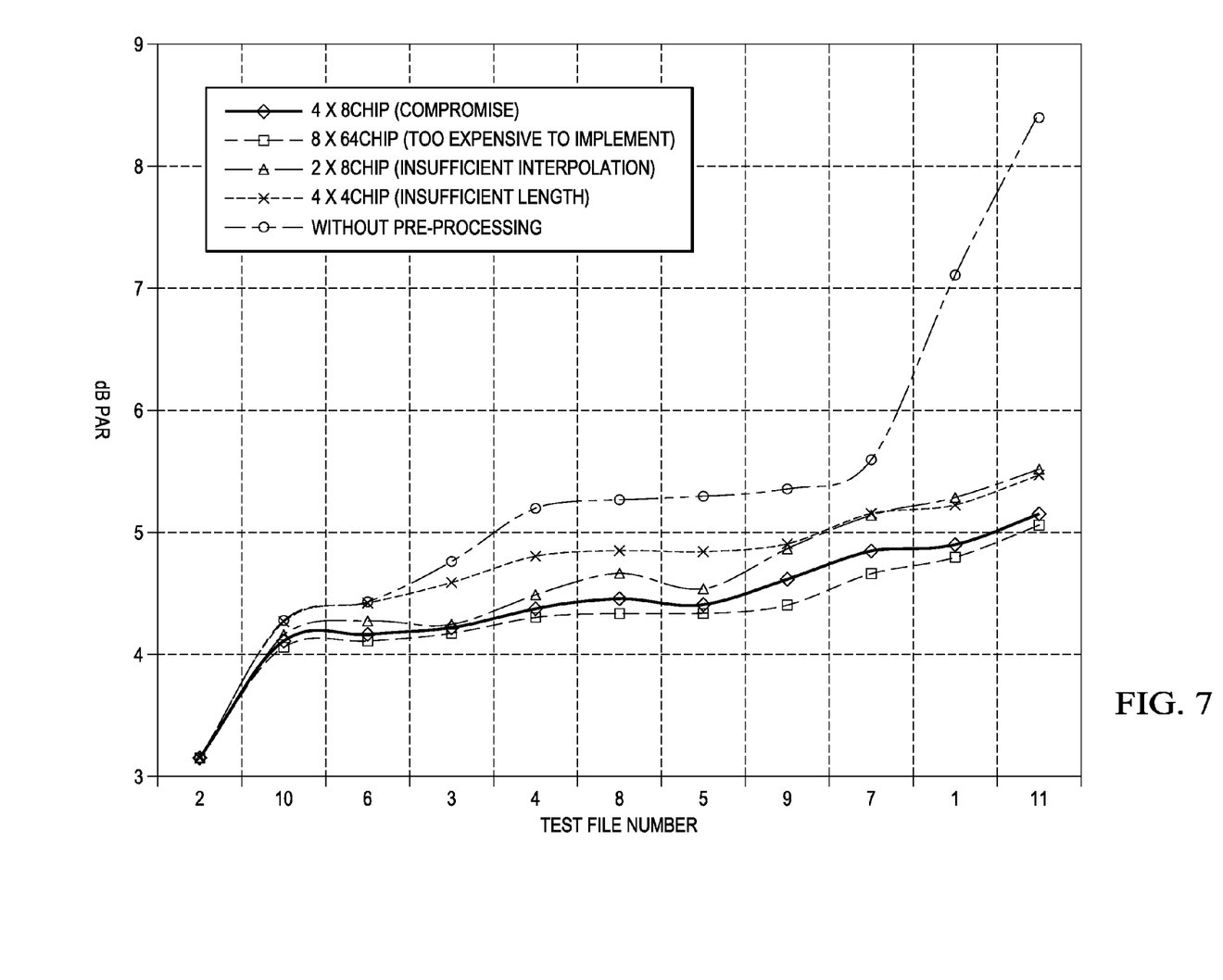
FIG. 7 is a plot showing PAR simulations results for different test files.

Some plots of simulation results are shown in FIGS. 7 and 8. In the simulation, the raw and pre-processed 3.84Msps uplink streams were post-processed with a near perfect (256-tap) 8× oversampled RRC filter. EVM added by the pre-processor is measured using the outputs of this RRC filter (compensate for slight power reduction due to pre-processing then measure RMS of difference as a percentage of the signal RMS). PAR is measured by ordering the outputs of the filter by magnitude and measuring the peak with a probability of 1e-3. Test file number 11 is AWGN (not from a file). All inputs are normalized to an RMS of 1. The value of Limit is set to 2.5 with the goal of limiting PAR to 10*log(2.5)=4 dB. (a higher limit would be chosen in practise for cases 1 and 11). Cases 2 and 10 have a PAR below (or very near to) 4 dB and consequently, are not affected much by the pre-processor. In this particular simulation, compensation applied by the pre-processor is never quite good enough to limit the PAR to the 4 dB threshold. However, a PAR reduction of about 1 dB can be achieved in exchange for worsening EVM by about 6%.

It will be appreciated that the above embodiments have been described only by way of example.

For instance, the disclosure is not limited by the examples of channel or predictor filters given above, and in other embodiments different types of filter or different numbers and/or values of filter coefficients could be used.

Where a pair of two instances of corresponding filters are shown duplicated on the I and Q branch in FIG. 4 (e.g. the pair $4_i$ and $4_q$, or $H0_i$ and $H0_q$, etc.), note that these could be implemented either as two constituent filters in parallel or as one same constituent filter in sequence. Similarly, where parallel instances of the sum-of-squares blocks $SSQ_0$-$SSQ_3$ are shown in FIG. 4 these could be implemented either as parallel operations or the same operation re-applied to the outputs of the different predictor filters H0-H3 in sequence. Parallel implementations are preferred for speed.

Further, although the above reduces complexity by using the sum of squares of the I and Q components as an indication of amplitude (i.e. the indicator is equal to the amplitude squared), other indicators are not excluded. For example it would be possible to use the actual amplitudes as the indicators and so to feed each actual amplitude into the MAX block 26 for comparison. However, this may increase the computational burden due to the multiple square root operation.

Further, it would be possible to used different equations or modifiers for limiting the first signal based on the amplitudes output by the predictor filters H0-H3, as long as it is adhered to the principle that the modifier is calculated directly based on an indication of the amplitude from a just one selected predictor filter.

In one implementation the components 2, 4, 6, 8, 16, H0-H3, $SSQ_0$-$SSQ_3$, 22, 24, 26, 28, 30, 32 and 34 are all implemented as software stored on a non-volatile data storage medium and arranged for execution on a processor such as a digital signal processor (DSP). However, in other implementations some or all of these components could alternatively be implemented wholly or partially in dedicated signal processing hardware.

Further, whilst the above has been described in terms of an application to a WCDMA system for transmitting on an uplink of a wireless cellular network, the principles of the disclosure are not limited to any one standard or scenario and can more generally be applied in any situation where it is desirable to limit the peak-to-average ratio of a signal to be transmitted from a power amplifier.

Other variants may become apparent to a person skilled in the art given the disclosure herein. The scope of the disclosure is not limited by the describe embodiments but only by the appendant claims.

The invention claimed is:

1. A method of limiting peak-to-average power of a signal transmitted from a power amplifier, the method comprising:
generating a first signal;
applying a pulse-shape filter to the first signal, thereby generating a second signal being a filtered version of the first signal;
outputting the second signal for transmission from a power amplifier;
applying each of a plurality of predictor filters to a respective instance of the first signal, each predictor filter approximating the application of the pulse-shape filter to the first signal based on a different respective set of filter coefficients, and each thereby generating a respective third signal;
determining an indicator of amplitude of each of the third signals;
selecting the indicator corresponding to the largest of said amplitudes;
generating a modifier based on the selected indicator; and
using the modifier to limit the first signal prior to applying the pulse-shape filter.

2. The method of claim 1, wherein the second and third signals are each complex comprising a respective pair of in-phase and quadrature components, and the determination of said indicator of amplitude of each of the third signals is based on the respective pair of in-phase and quadrature components combined.

3. The method of claim 1, wherein said indicator of amplitude is equal to the sum of the squares of the respective pair of in-phase and quadrature components, thus indicating the amplitude in terms of its square.

4. The method of claim 2, wherein said indicator of amplitude is equal to the sum of the squares of the respective pair of in-phase and quadrature components, thus indicating the amplitude in terms of its square.

5. The method of claim 1, wherein said modifier is a multiplicative factor, and said limiting comprises attenuating the first signal using said factor.

6. The method of claim 2, wherein said modifier is a multiplicative factor, and said limiting comprises attenuating the first signal using said factor.

7. The method of claim 3, wherein said modifier is a multiplicative factor, and said limiting comprises attenuating the first signal using said factor.

8. The method of claim 5, wherein the attenuating is performed on condition of said factor being less than one.

9. The method of claim 6, wherein the attenuating is performed on condition of said factor being less than one.

10. The method of claim 7, wherein the attenuating is performed on condition of said factor being less than one.

11. The method of claim 5, wherein said factor is substantially equal to
$1/\sqrt{(L/X)}$ where X is the selected indicator and L is a constant.

12. The method of claim 8, wherein said factor is substantially equal to
$1/\sqrt{(L/X)}$ where X is the selected indicator and L is a constant.

13. The method of claim 11, wherein said factor is generated by approximating $1/\sqrt{(L/X)}$ to equal $A+X(B+X(C+XD))$, where A, B, C and D are constants related to L.

14. The method of claim 12, wherein said factor is generated by approximating $1/\sqrt{(L/X)}$ to equal $A+X(B+X(C+XD))$, where A, B, C and D are constants related to L.

15. The method of claim 13, wherein A is substantially equal to 1.677, B is substantially equal to $-0.938/L$, C is substantially equal to $0.295/L^2$ and D is substantially equal to $-0.035/L^3$.

16. The method of claim 14, wherein A is substantially equal to 1.677, B is substantially equal to $-0.938/L$, C is substantially equal to $0.295/L^2$ and D is substantially equal to $-0.035/L^3$.

17. The method of claim 1, wherein the first signal comprises a partially modulated signal, and wherein the method comprises further modulating the second signal for transmission from said power amplifier.

18. The method of claim 1, wherein the transmission from the power amplifier is performed on an uplink of a wireless cellular network.

19. The method of claim 1, wherein the pulse-shape filter comprises a time domain filter.

20. The method of claim 1, wherein the pulse-shape filter comprises a root raised cosine filter.

21. The method of claim 20, wherein the root raised cosine filter is parameterised by a roll-off parameter $\alpha=-0.22$.

22. The method of claim 1, wherein each of the predictor filters comprises a time-domain filter.

23. The method of claim 1, wherein each of the predictor filters comprises a finite impulse response filter.

24. The method of claim 1, wherein each of the predictor filters represents the pulse-shape filter using a respective set of eight filter coefficients.

25. The method of claim 1, wherein the first signal is generated having a predetermined sample rate, and each of the predictor filters operates at four times the sample rate.

26. The method of claim 25, wherein the sample rate is a chip rate of a code division multiple access scheme.

27. The method of claim 1, comprising applying each of four predictor filters to a respective instance of the first signal.

28. The method of claim 1, comprising introducing a delay on a path between (a) the determination of the indicator of amplitude of the third signal from at least one but not all of the predictor filters and (b) the selection of the largest indicator.

29. The method of claim 28, wherein the largest indicator is selected from amongst a set including, determined from the third signal generated from the same predictor filter, at least one indicator with said delay applied and one indicator without said delay applied.

30. A computer program product for limiting peak-to-average power of a signal transmitted from a power amplifier, the computer program product comprising code embodied on a non-transient computer-readable medium and configured so as when executed on a processing apparatus to:
generate a first signal;
apply a pulse-shape filter to the first signal, thereby generating a second signal being a filtered version of the first signal;
output the second signal for transmission from a power amplifier;
apply each of a plurality of predictor filters to a respective instance of the first signal, each predictor filter approximating the application of the pulse-shape filter to the first signal based on a different respective set of filter coefficients, and each thereby generating a respective third signal;
determine an indicator of amplitude of each of the third signals;

select the indicator corresponding to the largest of said amplitudes;

generate a modifier based on the selected indicator; and use the modifier to limit the first signal prior to applying the pulse-shape filter.

31. The computer program product of claim 30, wherein the second and third signals are each complex comprising a respective pair of in-phase and quadrature components, and the determination of said indicator of amplitude of each of the third signals is based on the respective pair of in-phase and quadrature components combined.

32. A transmission system comprising:

a signal processing apparatus configured to generate a first signal and to apply a pulse-shape filter to the first signal, thereby generating a second signal being a filtered version of the first signal; and a power amplifier arranged to transmit the second signal for transmission from a power amplifier;

wherein the signal processing apparatus is further configured to:

apply each of a plurality of predictor filters to a respective instance of the first signal, each predictor filter approximating the application of the pulse-shape filter to the first signal based on a different respective set of filter coefficients, and each thereby generating a respective third signal;

determine an indicator of amplitude of each of the third signals;

select the indicator corresponding to the largest of said amplitudes;

generate a modifier based on the selected indicator; and use the modifier to limit the first signal prior to applying the pulse-shape filter.

33. The transmission system of claim 32, wherein said indicator of amplitude is equal to the sum of the squares of the respective pair of in-phase and quadrature components, thus indicating the amplitude in terms of its square.

* * * * *